US012581830B2

(12) United States Patent
Gao et al.

(10) Patent No.: US 12,581,830 B2
(45) Date of Patent: Mar. 17, 2026

(54) DISPLAY PANEL AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Yongxiao Gao, Beijing (CN); Tiejun Bi, Beijing (CN); Qiang Tang, Beijing (CN); Shiyou Wang, Beijing (CN); Danping Shen, Beijing (CN); Wei Zeng, Beijing (CN); Zheng Fang, Beijing (CN); Yuqiang Huang, Beijing (CN); Ziyan Zhong, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 414 days.

(21) Appl. No.: 18/032,349

(22) PCT Filed: Jun. 30, 2022

(86) PCT No.: PCT/CN2022/103068
§ 371 (c)(1),
(2) Date: Apr. 18, 2023

(87) PCT Pub. No.: WO2024/000490
PCT Pub. Date: Jan. 4, 2024

(65) Prior Publication Data
US 2025/0089521 A1 Mar. 13, 2025

(51) Int. Cl.
*H10K 59/80* (2023.01)
*H10K 102/00* (2023.01)

(52) U.S. Cl.
CPC ..... *H10K 59/871* (2023.02); *H10K 2102/311* (2023.02)

(58) Field of Classification Search
CPC ... H10K 59/871; H10K 2102/311; G09F 9/30
See application file for complete search history.

(56) References Cited

U.S. PATENT DOCUMENTS

2021/0191467 A1 6/2021 Sunwoo et al.
2021/0280097 A1* 9/2021 Lee ........................ G06F 1/1641
(Continued)

FOREIGN PATENT DOCUMENTS

CN 110648593 A 1/2020
CN 112420746 A 2/2021
(Continued)

*Primary Examiner* — J. E. Schoenholtz
(74) *Attorney, Agent, or Firm* — Ling Wu; Stephen Yang; Ling and Yang Intellectual Property

(57) ABSTRACT

A display panel is provided, including a flat display region, and a fixed region and a sliding-scrolling region on two sides of the flat display region in a first direction, the fixed region is adhered with a middle frame, the flat display region is configured to display images, the sliding-scrolling region is configured to form a rolled-up state and an extended state by sliding-scrolling, the sliding-scrolling region displays the image together with the flat display region in the extended state, on a plane perpendicular to the display panel, the display panel at least includes a display substrate, an adhesive layer disposed on the display substrate, and a cover plate layer on a side of the adhesive layer away from the display substrate, the cover plate layer at least includes a glass layer, the glass layer of at least one of the fixed region and the sliding-scrolling region has a structural hole.

18 Claims, 10 Drawing Sheets

(56)            References Cited

U.S. PATENT DOCUMENTS

| | | |
|---|---|---|
| 2021/0282285 A1 | 9/2021 | Sunwoo et al. |
| 2021/0315116 A1 | 10/2021 | Sunwoo et al. |
| 2021/0341970 A1 | 11/2021 | Lee et al. |
| 2021/0368634 A1 | 11/2021 | Song et al. |
| 2023/0042280 A1 | 2/2023 | Kim et al. |
| 2023/0259167 A1 | 8/2023 | Ahn et al. |
| 2024/0032229 A1* | 1/2024 | Han .................... H04M 1/0268 |
| 2024/0292555 A1* | 8/2024 | Jiang .................... G06F 1/1652 |
| 2025/0168996 A1* | 5/2025 | Jia ..................... B65H 75/4486 |

FOREIGN PATENT DOCUMENTS

| | | |
|---|---|---|
| CN | 113087402 A | 7/2021 |
| CN | 113362708 A | 9/2021 |
| CN | 113496653 A | 10/2021 |
| CN | 113570963 A | 10/2021 |
| CN | 113570968 A | 10/2021 |
| CN | 214541377 U | 10/2021 |
| CN | 114094027 A | 2/2022 |
| KR | 20210149568 A | 12/2021 |
| WO | 2021215812 A1 | 10/2021 |
| WO | 2022108362 A1 | 5/2022 |

* cited by examiner

DISPLAY PANEL AND DISPLAY DEVICE

CROSS-REFERENCE TO RELATED APPLICATION

The present application is a U.S. National Phase Entry of International Application PCT/CN2022/103068, having an international filing date of Jun. 30, 2022, and entitled "Display Panel and Display Device". The entire contents of the above-identified application are hereby incorporated by reference.

TECHNICAL FIELD

Embodiments of the present disclosure relate to, but are not limited to, the field of display technologies, and more particularly, to a display panel and a display device.

BACKGROUND

An Organic Light Emitting Diode (OLED for short) and a Quantum dot Light Emitting Diode (QLED for short) are active light-emitting display devices and have advantages such as self-luminescence, wide viewing angle, high contrast ratio, low power consumption, very high response speed, lightness and thinness, flexibility, and low cost. With continuous development of display technologies, an electronic display device using an OLED or QLED as a light emitting device and using a Thin Film Transistor (TFT) for signal control has become a mainstream product in the field of display at present.

SUMMARY

The following is a summary of subject matter described herein in detail. The summary is not intended to limit the protection scope of claims.

In one aspect, the present disclosure provides a display panel, the display panel includes a fixed region, a flat display region and a sliding-scrolling region, the fixed region and the sliding-scrolling region are respectively located on two sides of the flat display region in a first direction, the fixed region is configured to be fixedly connected with a middle frame, the flat display region is configured to display an image, the sliding-scrolling region is configured to form a rolled-up state and an extended state by sliding-scrolling, the sliding-scrolling region performs image displaying together with the flat display region in the extended state, on a plane perpendicular to the display panel, the display panel at least includes a display substrate, an adhesive layer disposed on the display substrate and a cover plate layer disposed on a side of the adhesive layer away from the display substrate, the cover plate layer at least includes a glass layer, at least one of the glass layer of the fixed region and the glass layer of the sliding-scrolling region is provided with at least one structural hole, a shape of the at least one structural hole is a strip shape extending along a second direction, and the first direction intersects with the second direction.

In an exemplary implementation, the at least one structural hole includes a first structural hole, the first structural hole is provided in the glass layer of the fixed region, a depth of the first structural hole is the same as a thickness of the glass layer of the fixed region, and the thickness of the glass layer of the fixed region is 50 μm to 200 μm.

In an exemplary implementation, a thickness of the glass layer of the sliding-scrolling region is 25 μm to 80 μm.

In an exemplary implementation, the at least one structural hole includes a second structural hole, the second structural hole is provided in the glass layer of the sliding-scrolling region, a depth of the second structural hole is the same as a thickness of the glass layer of the sliding-scrolling region, and the thickness of the glass layer of the sliding-scrolling region is 200 μm to 800 μm.

In an exemplary implementation, on a plane perpendicular to the display panel, a cross-sectional shape of the glass layer of the fixed region is an arc shape, and the arc-shaped glass layer of the fixed region is formed by a three-dimensional heat bending process.

In an exemplary implementation, the at least one structural hole includes a first structural hole and a second structural hole, the first structural hole is provided in the glass layer of the fixed region, and the second structural hole is provided in the glass layer of the sliding-scrolling region.

In an exemplary implementation, the cover plate layer further includes a filling layer, and the at least one structural hole is filled with the filling layer.

In an exemplary implementation, a material of the filling layer includes an organic polymer material.

In an exemplary implementation, a difference between a refractive index of the material of the filling layer and a refractive index of the glass layer is less than or equal to 0.005.

In an exemplary implementation, each structural hole has a length in the second direction and a width in the first direction, and the length is greater than the width.

In an exemplary implementation, in the second direction, the structural hole includes a first end part, a second end part, and a main body part between the first end part and the second end part, a shape of the main body part is a strip shape extending along the second direction on a plane parallel to the display panel, and shapes of the first end part and the second end part are semicircular.

In an exemplary implementation, the main body part includes end regions adjacent to the first end part and the second end part and a middle region away from the first end part and the second end part, and a width of the middle region is less than or equal to a width of an end region.

In an exemplary implementation, a width of the main body part gradually increases from the middle region to the end region.

In an exemplary implementation, the width of the middle region is 30% to 70% of the width of the end region.

In an exemplary implementation, the at least one structural hole includes multiple hole columns disposed sequentially along the first direction, each hole column includes multiple structural holes disposed sequentially along the second direction; the multiple hole columns includes multiple odd-numbered hole columns and multiple even-numbered hole columns, structural holes in the multiple odd-numbered hole columns are aligned with each other in the second direction, structural holes in the multiple even-numbered hole columns are aligned with each other in the second direction, and the structural holes in the odd-numbered hole columns and the structural holes in the even-numbered hole columns are staggered disposed in the second direction.

In an exemplary implementation, there is a first spacing between a centerline of structural holes of at least one odd-numbered hole column and a centerline of the structural holes of an even-numbered hole column adjacent in the first direction, the first spacing is 0.5 time to 3 times of the width, and the centerline is a line passing through geometric centers of the structural holes along the second direction.

In an exemplar implementation, in a hole column adjacent to at least one structural hole, there is a second spacing between the structural holes in the second direction, and the second spacing is 10% to 30% of the length.

In an exemplary implementation, there is a misaligned distance between a center point of a structural hole of at least one odd-numbered hole column and a center point of a structural hole of a staggered disposed even-numbered hole column adjacent in the first direction, the misaligned distance is 40% to 60% of the length, and the center point of the structural hole is a geometric center of the structural hole.

In another aspect, a display device is further provided by the present disclosure and the display panel includes the aforementioned display panel.

Other aspects may be understood upon reading and understanding of the drawings and detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

FIG. 9A-FIG. 9H are schematic diagrams of a manufacturing process of a glass layer according to an exemplary embodiment of the present disclosure.

4

Figure 14:
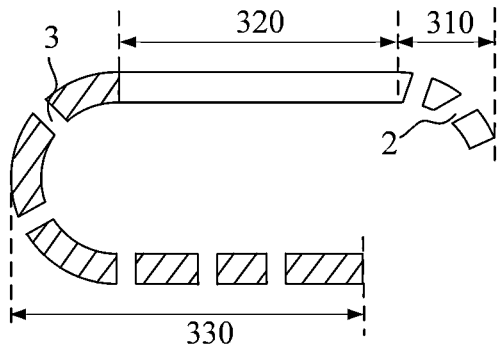

FIG. 14 is a schematic cross-sectional view of another glass layer according to an exemplary embodiment of the present disclosure.

DESCRIPTION OF REFERENCE SIGNS IN THE DRAWING 1-display panel;
2-first structural hole;
3-second structural hole;
4-organic polymer filling material;
10-display panel;
11-fixed region;
12-flat display region;
13-sliding-scrolling region;
20-adhesive layer;
30-cover plate layer;
31-glass layer;
40-protective layer;
41-glass substrate piece;
42-acid-proof ink;
43-mask plate;
44-lye;
45-acid etching solution;
51-glass carrier plate;
52-mold substrate;
53-filling material;
54-upper mold;
131-sliding-scrolling display region;
132-sliding-scrolling auxiliary region;
200-view area;
310-fixed part;
311-horizontal portion;
312-bending portion;
313-vertical portion;
320-flat part;
330-sliding-scrolling part;
331-first sub-sliding-scrolling portion;
332-second sub-sliding-scrolling portion.

DETAILED DESCRIPTION

To make objectives, technical solutions, and advantages of the present disclosure clearer, embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in an actual process, but are not limited thereto. For example, a width-length ratio of a channel, a thickness and spacing of each film layer, and a width and spacing of each signal line may be adjusted according to actual needs. The number of pixels in a display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integral connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, square, rectangle, trapezoid, pentagon and hexagon in this specification are not strictly defined, and they may be approximate triangle, square, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed, for example, within a range of ±1%, ±5%, ±10%, ±20%, ±30% of the numerical value.

With the development of display technologies, a flexible display device may be wound, folded and bent to change its screen size. Therefore, a rollable display device, a bendable display device, a foldable display device, a slidable display device, a slidable-scrollablbe display device, or the like is formed, which can be applied not only to a mobile devices such as a smart phone and a tablet personal computer, but also to a television, a vehicle display device, and a wearable apparatus, and application fields of the flexible display devices are expanding. Herein, an area of a display area of a slidable-scrollable display device may be adjusted, and the slidable-scrollable display device has features of convenient use, space saving and the like.

An exemplary embodiment of the present disclosure provides a display panel, the including a fixed region, a flat display region and a sliding-scrolling region. The fixed region and the sliding-scrolling region are respectively located at two sides of the flat display region in a first direction, the fixed region is configured to be fixedly connected with a middle frame, the flat display region is configured to display an image, the sliding-scrolling region is configured to form a rolled-up state and an extended state by sliding-scrolling. Image displaying is performed by the flat display region together with the sliding-scrolling region in the extended state. On a plane perpendicular to the display panel, the display panel at least includes a display substrate, an adhesive layer disposed on the display substrate and a cover plate layer disposed on a side of the adhesive layer away from the display substrate. The cover plate layer at least includes a glass layer, at least one of the glass layer of the fixed region and the glass layer of the sliding-scrolling region is provided with at least one structural hole. The at least one structural hole is in a strip shape extending along the second direction, and the first direction intersects with the second direction.

In an exemplary embodiment, the at least one structural hole includes a first structural hole provided in the glass layer of the fixed region. A depth of the first structural hole is the same as a thickness of the glass layer of the fixed region, and the thickness of the glass layer of the fixed region is 50 μm to 200 μm.

In an exemplary embodiment, the at least one structural hole includes a second structural hole provided in the glass layer of the sliding-scrolling region. A depth of the second structural hole is the same as a thickness of the glass layer of the sliding-scrolling region, and the thickness of the glass layer of the sliding-scrolling region is 200 μm to 800 μm.

In an exemplary embodiment, the at least one structural hole includes a first structural hole and a second structural hole. The first structural hole is provided in the glass layer of the fixed region and the second structural hole is provided in the glass layer of the sliding-scrolling region.

In an exemplary embodiment, the cover plate layer further includes a filling layer, and the at least one structural hole is filled with the filling layer.

Figure 1:
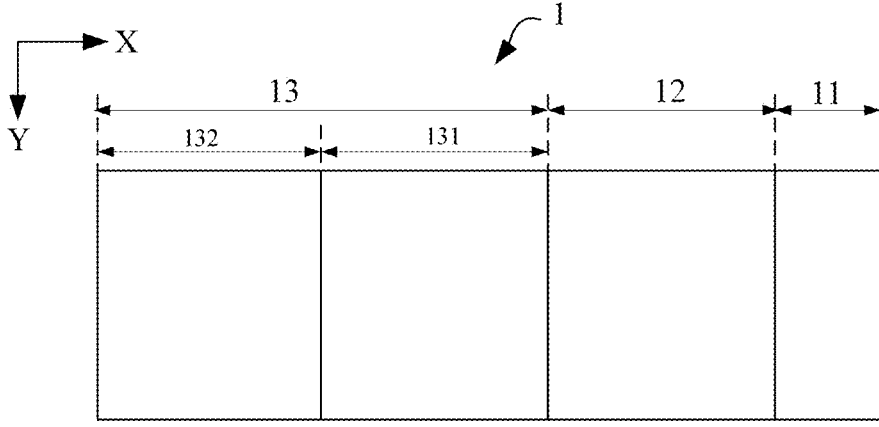
FIG. 1 is a schematic planar view of a display panel in an extended state.

FIG. 1 is a schematic planar view of a display panel in an extended state. As shown in FIG. 1, the display panel 1 may include a non-bending area and bending areas located on two sides of the non-bending area. The bending area may include a fixed region 11 and a sliding-scrolling region 13. The non-bending area may include a flat display region 12. The fixed region 11 and the sliding-scrolling region 13 are respectively located on two sides of the flat display region 12 in the first direction X. The sliding-scrolling region 13 may include a sliding-scrolling display region 131 and a sliding-scrolling auxiliary region 132, and the sliding-scrolling auxiliary region 132 does not participate in displaying and only assists in a sliding-scrolling process. The fixed region 11 is configured to be fixedly connected with a middle frame, such as by clamping, adhering or the like. The flat display region 12 is configured to be always in a plane state for displaying images. The sliding-scrolling region 13 is configured to form a rolled-up state and an extended state by sliding-scrolling. When the sliding-scrolling region is in the rolled-up state, an area of the view area is the smallest, and when the sliding-scrolling region is in the extended state, the area of the view area is the largest.

Figure 2A:
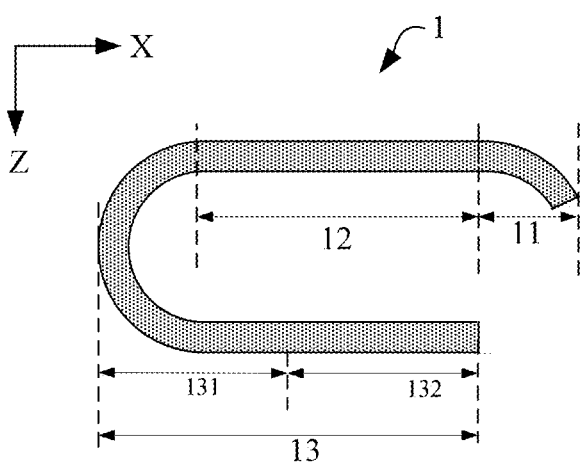
FIG. 2A-FIG. 2E show a sliding-scrolling process of a display panel.

FIG. 2A-FIG. 2E show a sliding-scrolling process of a display panel. As shown in FIG. 2A, when in the rolled-up state, the sliding-scrolling region 13 is bent and attached to side surfaces and back surface of a expansion mechanism (not shown) and does not participate in display, that is, the sliding-scrolling display region 131 is bent onto the side surfaces and back surface of the expansion mechanism along a direction opposite to the first direction X, and the sliding-scrolling auxiliary region 132 is located on a back surface of the flat display region 12 and is parallel to the flat display region 12. In the rolled-up state, neither the fixed region 11 nor the sliding-scrolling region 13 participates in displaying, and only the flat display region 12 becomes a display area of the display panel. In this case, an area of the view area is the smallest, so that the display device is easy to carry and is space-saving. An orthographic projection of the sliding-scrolling display region 131 and the sliding-scrolling auxiliary region 132 of the sliding-scrolling region 13 in the Z direction is at least partially overlapped with an orthographic projection of the flat display region 12 in the Z direction.

Figure 2B:
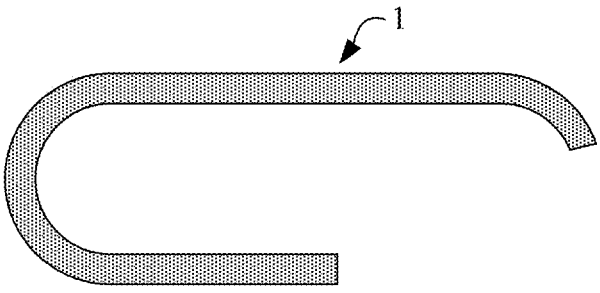
Figure 2C:
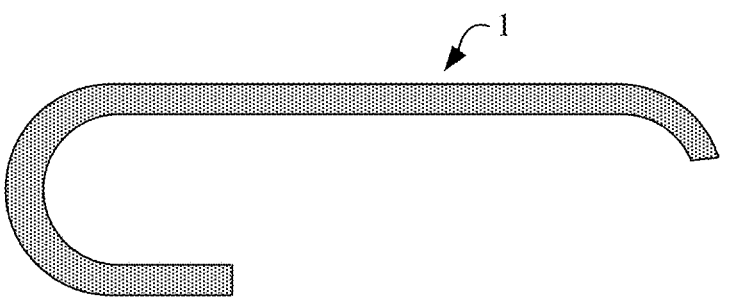
Figure 2D:
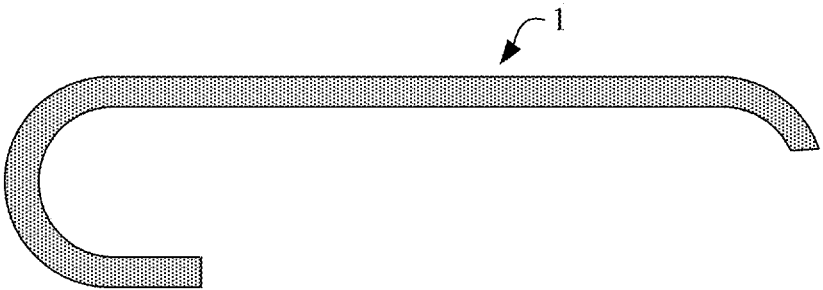

As shown in FIG. 2B-FIG. 2D, during a gradual transition from the rolled-up state to the extended state of the display panel, the sliding-scrolling region 13 is gradually extended into a plane by sliding and unfolding of the sliding-scrolling region 13.

Figure 2E:
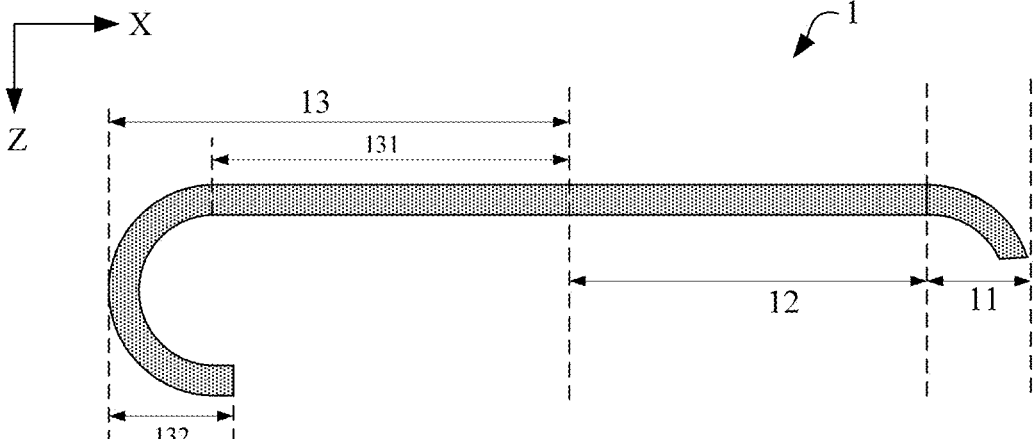

As shown in FIG. 2E, in the extended state, the sliding-scrolling region 13 slides and bends on the surface of the expansion mechanism with the help of a pulling force of the expansion mechanism, and is gradually extended into a plane, that is, the sliding-scrolling display region 131 is extended into a plane which is on a same plane as the flat display region 12, so that a view area in the sliding-scrolling region 13 performs image displaying together with the flat display region 12, while the sliding-scrolling auxiliary region 132 is bent and attached to the side surfaces of the expansion mechanism without participating in displaying. In the extended state, the fixed region 11 and the sliding-scrolling auxiliary region 132 of the sliding-scrolling region 13 do not participate in display, and only the flat display region 12 and the sliding-scrolling display region 131 of the sliding-scrolling region 13 become a display area of the display panel. In this case, an area of the view area is the largest, thereby enhancing the display effect of the display device. An orthographic projection of the sliding-scrolling display region 131 of the sliding-scrolling region 13 in the Z direction is not overlapped with the flat display region 12.

By rolling-up and extending of the sliding-scrolling region 13, a size range of the view area in the sliding-scrolling region 13 may be increased or decreased, and an area for displaying of the display device can be adjusted at will.

Figure 3:
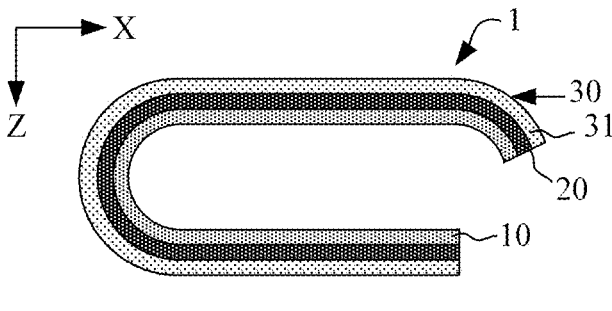
FIG. 3 is a schematic cross-sectional view of a display panel in a rolled-up state.

FIG. 3 is a schematic cross-sectional view of a display panel in a rolled-up state. As shown in FIG. 3, in the thickness direction (Z direction) of the display panel 1, the display panel 1 may at least include a display substrate 10, an adhesive layer 20 disposed on the display substrate, and a cover plate layer 30 disposed on a side of the adhesive layer 20 away from the display substrate 10.

In an exemplary implementation, the slidable-scrollable display device may include an electroluminescent display or other type of display. The electroluminescent display may include an Organic Light-Emitting Diode Display, a Quantum Dot Light Emitting Diodes, or a Micro-LED Display.

In an exemplary implementation, the display substrate 10 may be an OLED display substrate. The OLED display substrate may at least include a drive circuit layer disposed on a base substrate, and a light-emitting structure layer disposed on the drive circuit layer. The light-emitting structure layer may include an anode, a cathode, and an organic light-emitting layer disposed between the anode and the cathode. The organic light-emitting layer may include a hole injection layer, a hole transport layer, an electron barrier layer, a light-emitting layer, a hole barrier layer, an electron transport layer, an electron injection layer, and the like that are stacked.

In an exemplary implementation, the adhesive layer 20 may be made of an optically clear adhesive (OCA) or an optically clear resin, and the optically clear resin may be a thermosetting type optically clear resin or an ultraviolet curing type optically clear resin.

In an exemplary implementation, the cover plate layer 30 may at least include a glass layer 31 and a protective layer.

In an exemplary implementation, the cover plate layer 30 may further include a buffer layer or the like.

In an exemplary implementation, the protective layer may be made of polyimide (CPI), polyethylene terephthalate (PET) or other materials.

In exemplary implementation, the display device may further include other film layers such as touch films, polarizers, and the like. For example, in a thickness direction of the display device, the display device may further include a back film layer disposed on a side of the display substrate away from the adhesive layer 20 and a support layer disposed on a side of the back film layer away from the display substrate 10.

A conventional slidable-scrollable display device generally use a cover window assembly including a Cover Glass, and the assembly is bent at a fixed curvature and adhered to the middle frame of the display device by a fixed part provided in an edge area of this assembly. However, it is found in study that, if the cover glass is made of glass with a larger thickness of 200 μm-800 μm, then, when the fixed part is bent at a fixed curvature, because a Young's modulus of film materials such as CPI or PET in the cover window assembly is quite different from a Young's modulus of the cover glass itself, excessive resilience force (force tending to restoring a flat state) will be generated in the fixed part, which will easily cause the film layers of the fixed part to peel off or separate. If glass with a thickness less than 200 μm, although the resilience force of the fixed part is reduced, impact resistance of the cover glass itself is weakened. Therefore, the conventional slidable-scrollable display device has a problem that there is a contradiction between the impact resistance strength of the cover window and the resilience force generated when the fixed part of the cover window is bent.

Figure 4:
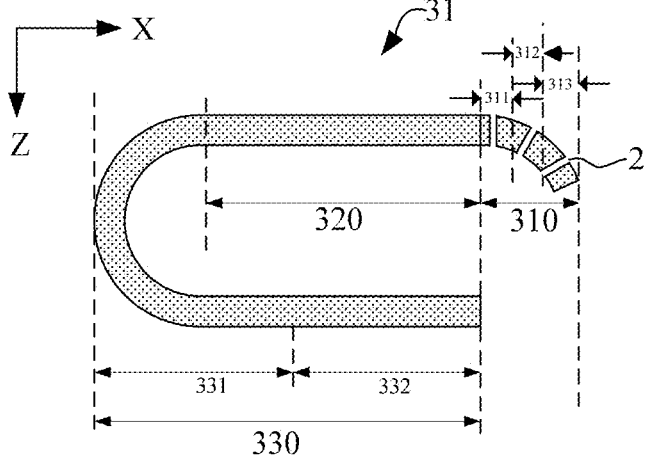
FIG. 4 is a schematic cross-sectional view of a glass layer according to an exemplary embodiment of the present disclosure.

FIG. 4 is a schematic cross-sectional view of a glass layer according to an exemplary embodiment of the present disclosure. As shown in FIG. 4, the glass layer 31 may include a bending part and a non-bending part corresponding to the bending area and the non-bending area of the display panel. The bending part may include a sliding-scrolling part 330 and a fixed part 310. The non-bending part may include a flat part 320. The fixed part 310 may be connected with the flat part 320 and positioned on a side of the flat part 320 in the first direction X. The sliding-scrolling part 330 may be connected with the flat part 320 and positioned on a side of the flat part 320 in an opposite direction the first direction X. The fixed part 310 may be bent from the flat part 320 toward the Z direction along the first direction X. The sliding-scrolling part 330 may include a first sub-sliding-scrolling portion 331 connected with the flat part 320 and a second sub-sliding-scrolling portion 332 located on a side of the first sub-sliding-scrolling portion 331 away from the flat part 320.

In an exemplary implementation, the fixed part 310 may include a horizontal portion 311 connected with the fixed part 310, a bending portion 312 located on a side of the horizontal portion 311 away from the fixed part 310, and a vertical portion 313 located on a side of the bending portion 312 away from the horizontal portion 311. The horizontal portion 311 has a first curvature, the bending portion 312 has a second curvature, and the vertical portion 313 has a third curvature. The second curvature is much larger than the first curvature and the third curvature.

In an exemplary implementation, at least one first structural hole 2 may be provided in the fixed part 310. The at least one first structural hole 2 may be in a form of a through-hole structure, i.e. the at least one first structural hole 2 penetrates through the glass layer 31, and a depth of the at least one first structural hole 2 is the same as a thickness of the glass layer 31.

In an exemplary implementation, a thickness of the fixed part 310 of the glass layer 31 may be in a range of about 50 μm to about 200 μm, for example, the thickness of the fixed part may be 60 μm, 90 μm, 120 μm, 150 μm.

In an exemplary implementation, a thickness of the sliding-scrolling part 330 of the glass layer 31 may be in a range of about 25 μm to about 80 μm, for example, the thickness of the sliding-scrolling part may be 40 μm, 50 μm, 60 μm, or the like. In this thickness range, the glass of the sliding-scrolling part itself can have a bending performance.

In a possible exemplary implementation, a cross-sectional shape of the fixed part 310 may be an arc shape and the fixed part 310 of the arc shape may be formed by a three-dimensional hot bending process or the like.

Figure 5:
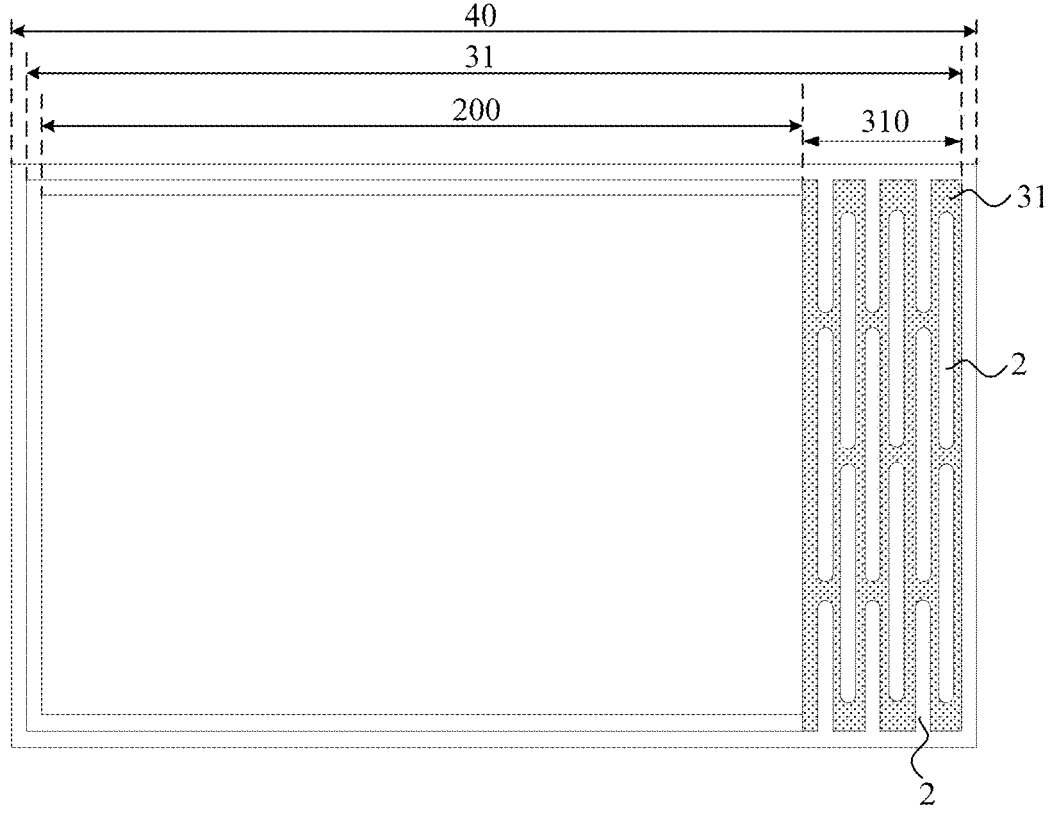
FIG. 5 is a schematic planar view of a cover plate layer according to an exemplary embodiment of the present disclosure.

FIG. 5 is a schematic planar view of a cover plate layer according to an exemplary embodiment of the present disclosure. As shown in FIG. 5, the cover plate layer includes a glass layer 31 and a protective layer 40 (such as a CPI or PET layer) (the adhesive layer is not shown). An orthographic projection of the protective layer 40 on the display substrate is larger than an orthographic projection of the glass layer 31 on the display substrate. The orthographic projection of the glass layer 31 on the display substrate is larger than an orthographic projection of the view area (VA) 200 on the display substrate. Multiple first structural holes 2 are provided in the fixed part 310 of the glass layer 31. The protective layer 40 corresponding to the fixed part 310 is completely coated with ink so that the fixed part 310 cannot perform displaying and it is only for decoration and maintains the existing design style.

In an exemplary implementation, a cover plate layer 30 including a CPI layer 40 of 80 μm, an optically clear (OCA) adhesive layer 20 of 50 μm, and a glass layer 31 of 70 μm is employed, multiple structural holes are provided in the fixed part 310 of the glass layer 31 of the cover plate layer 30, a performance test for such a cover plate layer shows that its bending performance at normal temperature, high temperature and low temperature can meet the level R5 of outward folding, at the same time, and its pen-down test data can be as high as 20 cm, that is, the impact resistance is good, and the resilience force of the fixed part is also significantly reduced, thus reducing the risk of peeling or separation among the film layers in the fixed part.

Figure 6:
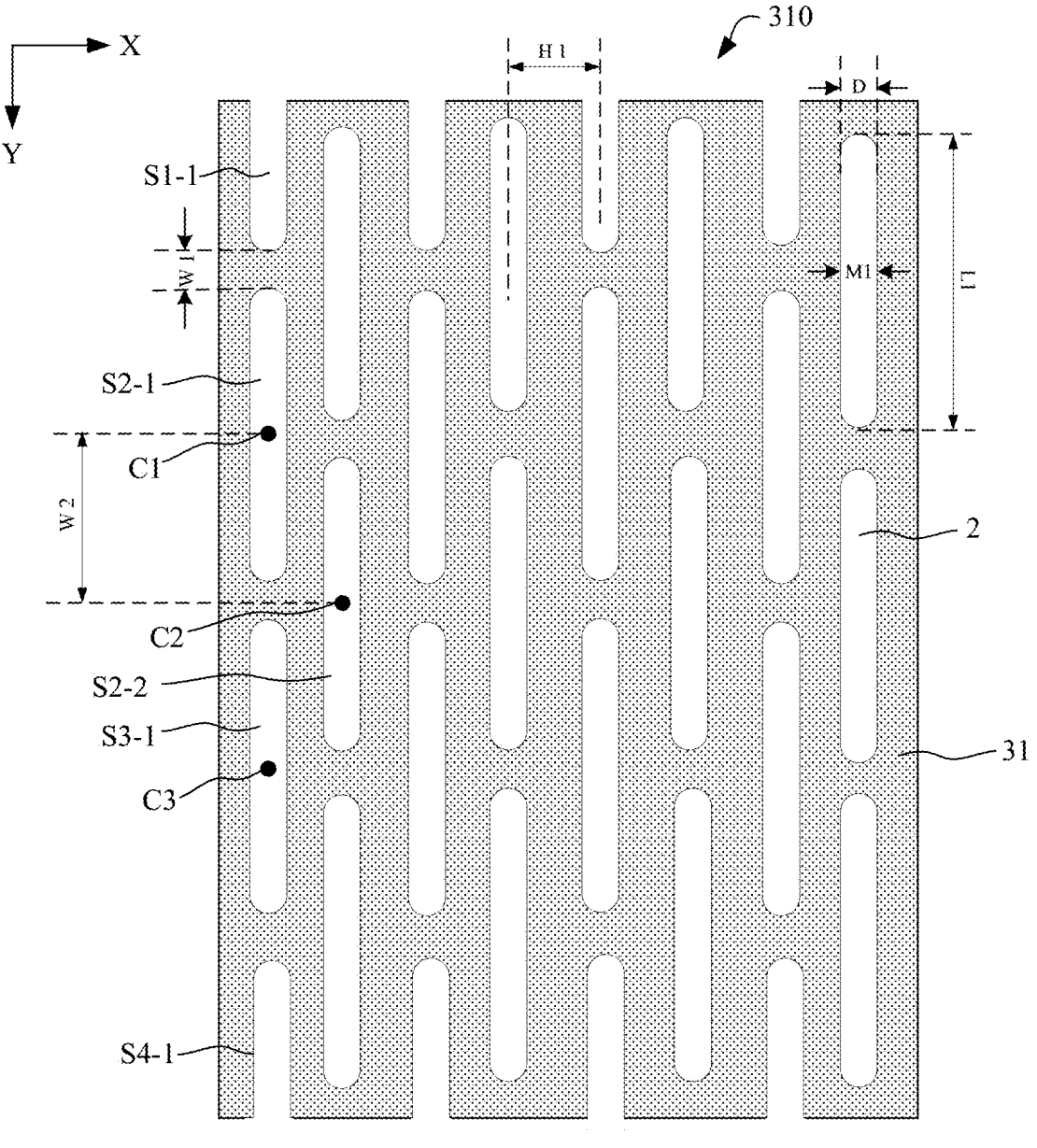
FIG. 6 is a schematic planar view of a glass layer of a fixed part according to an exemplary embodiment of the present disclosure.

FIG. 6 is a schematic planar view of a glass layer of a fixed part according to an exemplary embodiment of the present disclosure, showing an arrangement of multiple first structural holes 2 having a strip shape of equal cross-sectional width in the glass layer 31 in the fixed part 310. As shown in FIG. 6, the multiple first structural holes 2 may be arranged in the first direction X and a second direction Y intersecting with the first direction X. A shape of the first structural holes 2 may be a strip shape extending along the second direction Y. The multiple first structural holes may be provided in an array including multiple hole columns, and the multiple hole columns are sequentially disposed along the first direction X. At least one hole column may include multiple first structural holes 2 provided sequentially along the second direction Y, the multiple hole columns are disposed sequentially along the first direction X, and may be referred to as a first hole column, a second hole column . . . an n-th hole column from left to right. Herein, n is a positive integer greater than or equal to 2.

In an exemplary implementation, the structural holes may include multiple odd-numbered hole columns and multiple even-numbered hole columns. Structural holes in the odd-numbered hole columns and structural holes in their adjacent even-numbered hole columns in the first direction X may be staggered disposed in the second direction Y. For example, the structural holes of the first hole column and the structural holes of the second hole column may be staggered disposed in the second direction Y, the structural holes of the second hole column and the structural holes of the third hole column may be staggered disposed in the second direction Y, and so on.

In an exemplary implementation, structural holes in an odd-numbered hole column may be disposed in alignment in the second direction with the structural holes in another odd-numbered hole column separated by the even-numbered hole column in the first direction. For example, the structural holes of the first hole column may be disposed in alignment with the structural holes of the third hole column in the second direction Y, the structural holes of the second hole column may be disposed in alignment with the structural holes of the fourth hole column in the second direction Y, and so on.

Each first structural hole 2 may have a first length L1 and a first width M1. The first length L1 may be a size of the first structural hole 2 in the second direction Y. The first width M1 may be a size of the first structural hole 2 in the first direction X. The first length L1 may be in a range of 3000 μm to 4000 μm for an example. The first width M1 may be in a range of 100 μm to 400 μm for an example.

In the second direction Y, the structural hole may include a first end part, a second end part, and a main body part between the first end part and the second end part. A shape of the main body part is a strip shape extending along the second direction on a plane parallel to the display panel, and shapes of the first end part and the second end part are semicircular.

In an exemplary implementation, the semicircles of the first end part and the second end part each have a diameter D. The diameter D may be in a range of 100 μm to 400 μm for an example.

In an exemplary implementation, the main body part may include end regions close to the first end part and the second end part, and a middle region away from the first end part and the second end part.

In an exemplary implementation, a width of the middle region may be equal to a width of an end region.

In an exemplary implementation, there may be a first spacing between centerline of structural holes of at least one odd-numbered hole column and centerlines of structural holes of an even-numbered hole column adjacent in the first direction X, and a centerline is a line passing through a geometric center of the structural holes along the second direction Y. For example, there is a first spacing H1 between the centerlines of adjacent first structural holes 2 in the first direction X. The first spacing H1 may be in a range of 300 μm to 500 μm for an example. For example, the first spacing H1 may be 1.2 times to 3 times of the first width M1.

In an exemplary implementation, in a hole column adjacent to at least one structural hole, there may be a second spacing between structural holes in the second direction Y. For example, the second spacing may refer to a distance between a second end part of a structural hole and a first end part of another adjacent structural hole at a side along the second direction Y in at least one hole column. For example, in the second direction Y, there is a second spacing W1 between adjacent first structural holes 2, which may be in a range of 100 μm to 300 μm for an example. For example, the second spacing W1 may be 10% to 30% of the first length L1.

In an exemplary implementation, each first structural hole 2 may have a center point, and the center point is a geometric center of the first structural hole. The center points of the first structural holes 2 adjacent to each other in the first direction X may be staggered disposed in the second direction Y.

In an exemplary implementation, a center point of a structural hole of at least one odd-numbered hole column may have a misaligned distance from a center point of a structural hole of a even-numbered hole column staggered disposed adjacent in the first direction X. For example, there may be a misaligned distance W2 between a center point C1 of a structural hole S2-1 of the first hole column and a center point C2 of a structural hole S2-2 of the second hole column adjacent in the first direction X. The misaligned distance W2 may be in a range of 1500 μm to 2000 μm for example. For example, the misaligned distance may be 40% to 60% of the first length L1.

In an exemplary implementation, in an odd-numbered hole column adjacent to at least one structural hole, a midpoint between two center points of structural holes adjacent in the second direction Y may be flush in the first direction X with a center point of at least one structural hole of an even-numbered hole columns adjacent in the first direction X. For example, a midpoint along the second direction Y between the center point C1 of the first structural hole S2-1 and a center point C3 of a first structural hole S3-1 of the first hole column may be flush with the center point C2 of the first structural hole S2-2 of the second hole column.

In an exemplary implementation, a portion of a first structural hole S1-1 in the first hole column may be provided at an upper side edge of the fixed part 310, that is, the first structural hole S1-1 at the upper side edge of the fixed part 310 has no first end part and is in an open form. A portion of a first structural hole S4-1 in the first hole column may be provided at a lower side edge of the fixed part 310, that is, the first structural hole S4-1 at the lower side edge of the fixed part 310 has no second end part and is in an open form. A portion of a first structural hole S1-3 in the third hole column may be provided at the upper side edge of the fixed part 310, and the first structural hole S1-3 at the upper side edge of the fixed part 310 has no first end part and is in an open form. A portion of the first structural hole S4-3 in the third hole column may be provided at the lower side edge of the fixed part 310, that is, the first structural hole S4-3 at the lower side edge of the fixed part 310 has no second end part and is in an open form. The first structural holes of odd-numbered columns may be similarly disposed.

In an exemplary implementation, a first structural hole S1-2 in the second hole column may be provided at the upper side edge of the fixed part 310, that is, the first structural hole S1-2 at the upper side edge of the fixed part 310 has a complete first end part and a complete second end part. A first structural hole S4-2 in the second hole column may be provided at the lower side edge of the fixed part 310, that is, the first structural hole S4-2 at the lower side edge of the fixed part 310 has a complete first end part and a complete second end part. The first structural holes of even-numbered columns may be similarly disposed.

According to the present disclosure, the glass in a thickness range of 50 μm to 200 μm has bending characteristics and certain impact resistance, so it is only necessary to provide multiple structural holes in the fixed part at the edge of the glass layer to reduce the resilience force generated in the fixed part when the display panel is bent, and further reduce the risk of peeling or separation among the film layers in the fixed part.

Figure 7A:
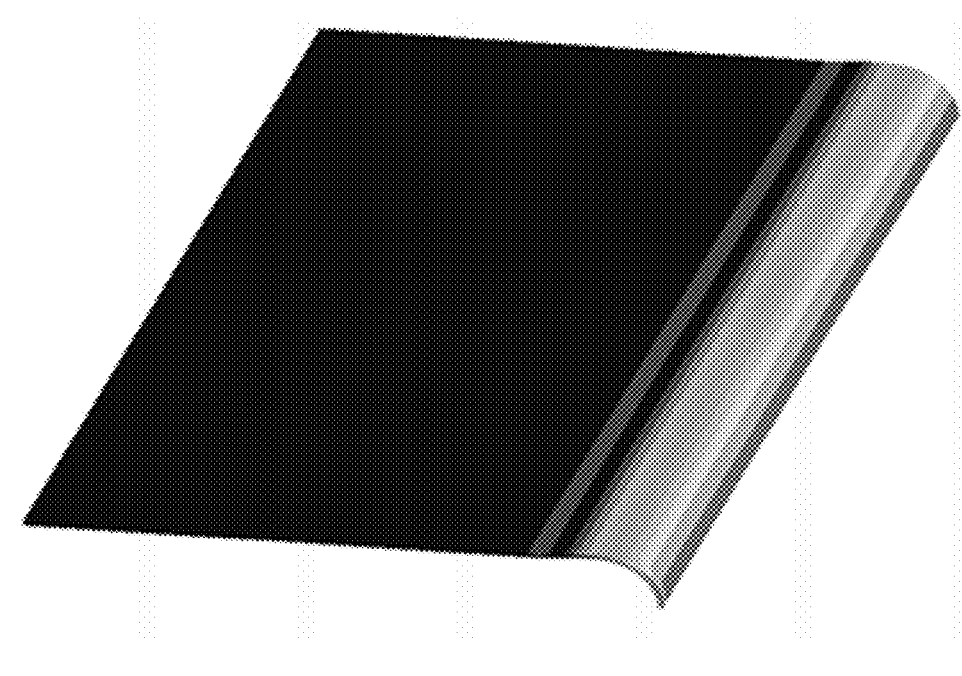
FIG. 7A and FIG. 7B are stress simulation diagrams of a fixed part excluding a structural hole and a fixed part including a structural hole according to an exemplary embodiment of the present disclosure respectively.
Figure 7B:
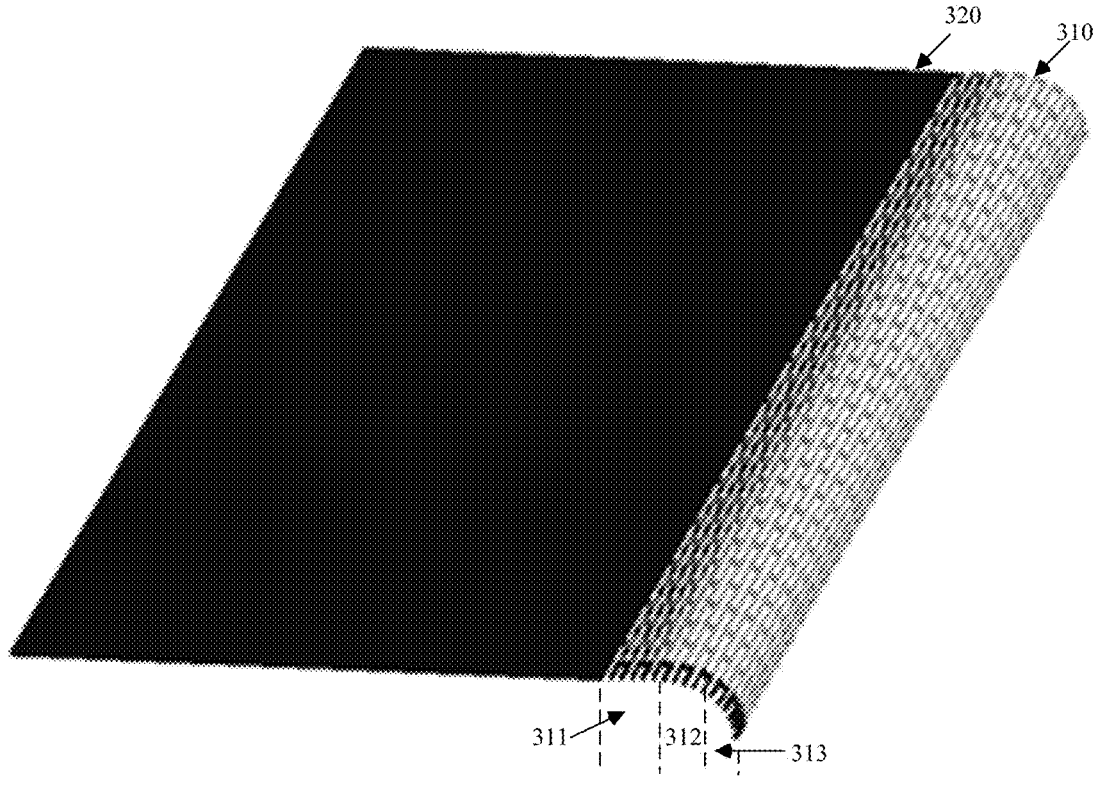

The present disclosure employs glass with an elastic modulus between 50 GPa-100 GPa, such as 70 GPa, and the thickness of the fixed part is 50 μm-200 μm. For example, glass of 150 μm, is used as an experimental object. The experimental conditions are that a bending radius R of the fixed part is 3 mm and a bending angle is 90°. Stress simulation is carried out on the glass layer of the fixed part without first structural holes and the glass layer of the fixed part disposed with the first structural holes, respectively. The stress simulation diagrams are shown in FIG. 7A and FIG. 7B respectively. As can be seen from FIG. 7A and FIG. 7B, the fixed part 310 may include a horizontal portion 311 connected with a flat part 320, a bending portion 312 on a side of the horizontal portion 311 away from the flat part 320, and a vertical portion 313 on a side of the bending portion 312 away from the horizontal portion 311. By providing the structural holes, the resilience force at an outermost portion of the vertical portion 313 is significantly reduced from 3713 MPa without the structural holes provided, to 246 MPa, with a decrease of 93.4%. At a junction between the vertical portion 313 and the bending portion 312, the resilience force can be reduced from 2475 MPA to 165 MPA. This proves that when the slidable-scrollable display device is bent, by providing multiple structural holes in the fixed part at the edge of the glass layer, the resilience force generated by the fixed part can be significantly reduced, and the impact resistance of the sliding-scrolling part can be ensured without loss.

Figure 8:
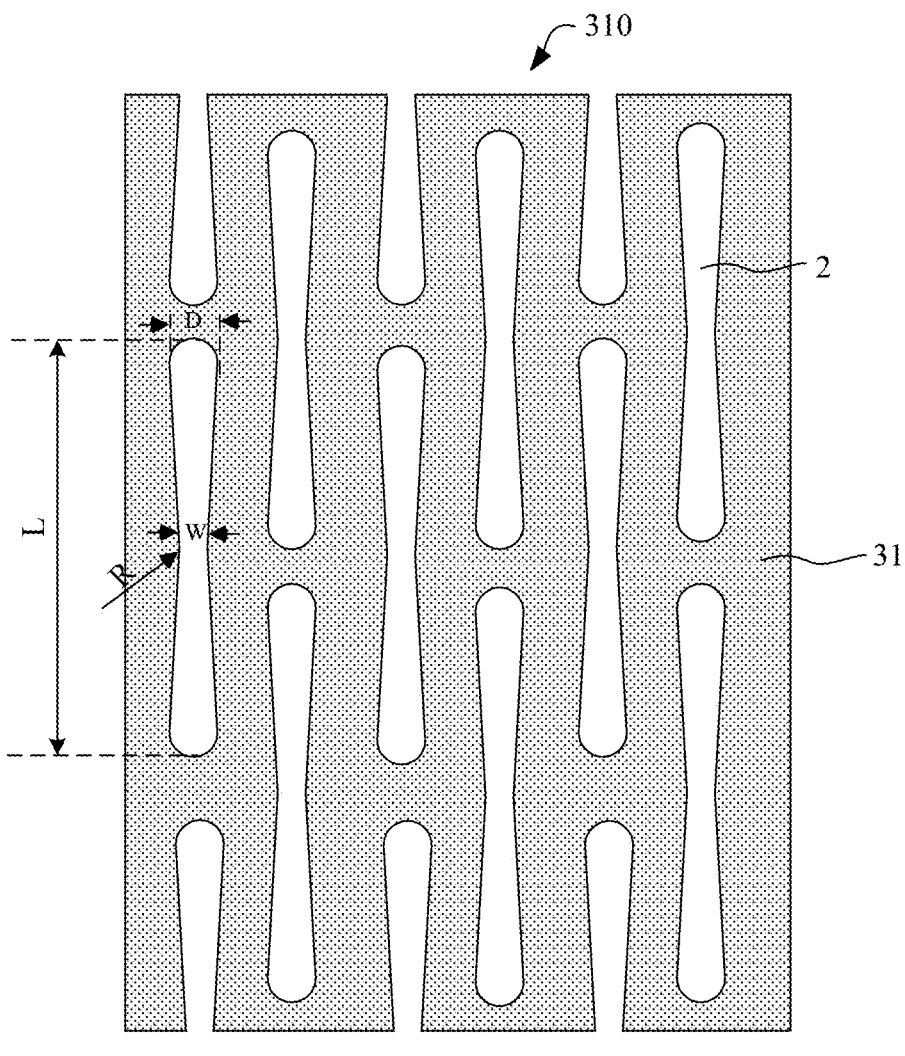
FIG. 8 is a schematic planar view of a glass layer of another fixed part according to an exemplary embodiment of the present disclosure.

FIG. 8 is a schematic planar view of a glass layer of another fixed part according to an exemplary embodiment of the present disclosure, showing an arrangement of multiple first structural holes 2 in strip shapes with variable cross-sectional widths in the glass layer 31 in the fixed part 310. As shown in FIG. 8, the multiple first structural holes 2 may be arranged in the first direction X and the second direction Y intersecting with the first direction X. The multiple first structural holes 2 may be arranged in an array, including multiple hole columns.

In an exemplary implementation, in the second direction, each first structural hole 2 includes a first end part, a second end part, and a main body part between the first end part and the second end part. A shape of the main body part is a strip shape extending along the second direction on a plane parallel to the display panel, and shapes of the first end part and the second end part are semicircular.

Each first structural hole 2 may have a length L extending in the second direction Y, and the length L may be in a range of 2000 μm to 7000 μm.

A width W of the first structural hole 2 is the narrowest at the middle, and the width W may be in a range of 150 μm to 200 μm. Two curved contours of the first structural hole 2 extending along the second direction Y extend with a radius of curvature R from the middle to the two ends along the second direction Y and along a direction opposite to the second direction Y respectively, until the widths of the ends are the largest, i.e. a width of the middle of the first structural hole 2 is smaller than a width of an end of the first structural hole 2. The radius of curvature R may be, for example, in a range of 25,000 μm to 30,000 μm (25 mm to 30 mm).

In an exemplary implementation, the main body part may include end regions close to the first end part and the second end part and a middle region away from the first end part and the second end part, and a width of the middle region may be less than a width of an end region.

In an exemplary implementation, the width of the main body part may gradually increase from the middle region to the end region, and the width of the middle region may be 30% to 70% of the width of the end region.

In an exemplary implementation, each first structural hole 2 has a center point, and the center point is a geometric center of the first structural hole. Center points of first structural holes 2 adjacent to each other in the first direction X may be staggered disposed in the second direction Y.

In an exemplary implementation, in the bending portion of the fixed part, a density of the first structural holes in the bending portion may be the largest due to a maximum stress applied to the bending portion, and then the density of the first structural holes may be gradually reduced along a direction away from the first direction X, that is, a direction from the bending portion to the horizontal portion, and in a direction toward the first direction X, that is, the direction from the bending portion to the vertical portion.

In an exemplary implementation, the width of the first structural holes in the hole columns in the bending portion of the fixed part may also be maximum, and then the width of the first structural holes in hole columns may be gradually reduced in a direction away from the first direction X, that is, the direction from the bending portion to the horizontal portion, and in a direction of the first direction X, that is, the direction from the bending portion to the vertical portion.

In an exemplary implementation, since the widths of the structural holes in the multiple hole columns are different, the first spacing H1 may also be varied, for example, the first spacing H1 may be 0.5 times to 3 times of the first width M1.

The width of the main body part of the structural hole in this embodiment gradually decreases from the end region toward the middle region, that is, it has a gradually inwardly contracted shape. Compared with the scheme in which the width from the end region to the middle region of the main body part is constant as shown in FIG. 6, this design can decompose the stress received during bending in multiple directions, thereby reducing the maximum stress during bending and improving the fatigue resistance. On the other hand, since the main body part of the structural hole is gradually inwardly contracted from the end region toward the middle region, more structural holes can be provided in the glass layer per unit area, so that an arrangement density of the structural holes is larger, thereby reducing the maximum stress during bending, improving the fatigue resistance without reducing the resilience force.

In an exemplary implementation, on a plane parallel to the display substrate, the shapes of structural holes may also include any one or more of the following: triangle, square, rectangle, pentagon, hexagon, semicircle, circle and ellipse.

FIG. 9A-FIG. 9H are schematic diagrams of a manufacturing process of a glass layer according to an exemplary embodiment of the present disclosure. In an exemplary implementation, the manufacturing process of the glass layer may include the following steps.

Figure 9A:

(1) A glass substrate piece 41 is provided and cleaned, and the glass substrate piece 41 may have a size of about 500 mm*500 mm and a thickness of about 60 μm-100 μm, such as about 70 μm, as shown in FIG. 9A.

Figure 9B:
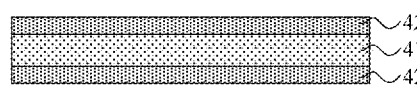

(2) Acid-proof ink 42 is uniformly coated on an upper surface and a lower surface of the glass substrate piece 41, as shown in FIG. 9B.

Figure 9C:
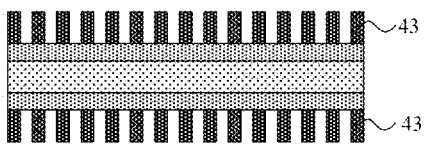

(3) A mask plate 43 is disposed on the acid-proof ink 42, as shown in FIG. 9C.

Figure 9D:

(4) The acid-proof ink 42 is exposed and the mask plate 43 is removed, as shown in FIG. 9D.

(5) Subsequently, the glass substrate piece coated with an acid-proof film is immersed in a lye 44, a part of the acid-proof ink that is exposed is alkaline washed, and then washed with water, as shown in FIG. 9E and FIG. 9F.

(6) The cleaned glass substrate with a part of the acid-proof film is immersed in an acid etching solution 45 to carry out acid etching and cleaning, as shown in FIG. 9G.

(7) All the acid-proof films are removed to obtain a glass substrate piece 41 with a first structural holes 2, as shown in FIG. 9H.

For the glass layer formed with structural holes, it further needs to undergo thinning and strengthening in a later stage, and the desired glass layer can be obtained by employing a conventional process flow in the art, including laser cutting, laminating, cutting, edge enhancement, laminating and chemical enhancement, and the like.

In an exemplary implementation, the acid-proof film may be an acid-proof film with its own pattern, or may be manufactured by conventional processes in the art, such as a yellow light process including coating PR glue, re-exposure, development, etching, etc. to obtain the acid-proof film with a desired pattern.

In some possible exemplary implementations, the structure holes may be formed in the form of through holes in the glass layer by laser punching, which is not limited in the present disclosure.

Figure 10:
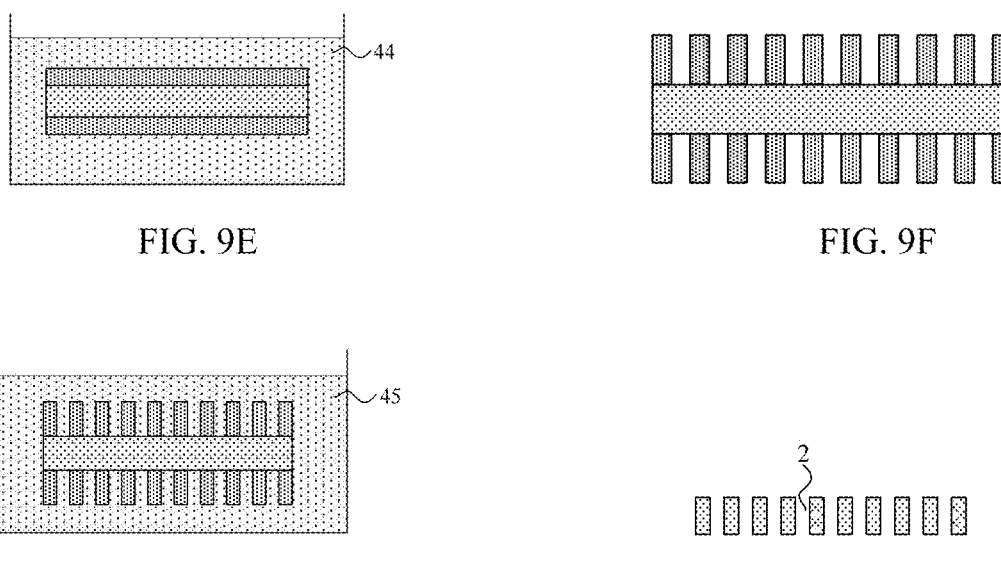
FIG. 10 is a schematic planar view of another cover plate layer according to an exemplary embodiment of the present disclosure.
Figure 10:
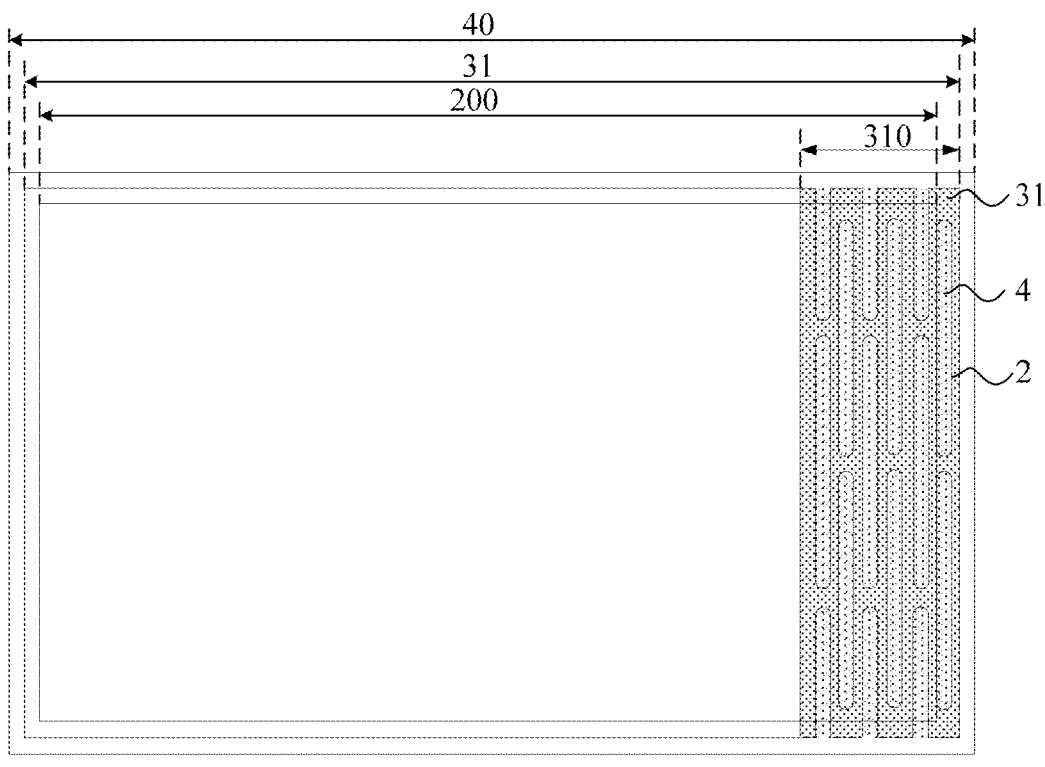

FIG. 10 is a schematic planar view of another cover plate layer according to an exemplary embodiment of the present disclosure. As shown in FIG. 10, the cover plate layer includes a glass layer 31 and a protective layer 40 (e.g. a CPI layer or a PET layer). An orthographic projection of the protective layer 40 on the display substrate is larger than an orthographic projection of the glass layer 31 on the display substrate. The orthographic projection of the glass layer 31 on the display substrate is larger than an orthographic projection of the view area (VA) 200 on the display substrate. Multiple first structural holes 2 are provided in the fixed part 310 of the glass layer 31.

In an exemplary implementation, the cover plate layer may further include a filling layer, and the first structural holes 2 are filled with the filling layer.

In an exemplary implementation, the filling layer may include an organic polymer filling material 4.

In an exemplary implementation, a difference between a refractive index of the filling material 4 of the filling layer and a refractive index of the glass layer 31 may be less than or equal to 0.005. For example, the filling material may be selected from polyimide, polyurethane, polymethyl methacrylate type, etc.

In the present disclosure, by filling the first structural holes with the organic polymer filling material, it can not only avoid a light and shadow problem caused by providing the structural holes, but also reduce the resilience force of the fixed part, and at the same time keep the bending region with extremely high impact resistance and good surface touch.

In an exemplary implementation, it is also possible to coat ink on the fixed part 310 so that the widths of the ink regions at the left, right, upper and lower part of the fixed part 310 are equal, thereby enabling the fixed part 310 to realize the display function and extending the view area (VA) 200 to the fixed part 310.

By providing multiple structural holes in the fixed part 310 and filling the structural holes with a specific polymer material, the range of the view area (VA) 200 may be extended to the fixed part 310, thereby increasing an area of the view area (VA) 200 and enhancing the use experience and viewing comfort of a user.

FIG. 11A-FIG. 11D are schematic diagrams of a filling process of first structural holes according to an exemplary embodiment of the present disclosure. In an exemplary implementation, a filling process of the structural holes may include the following steps.

Figure 11A:
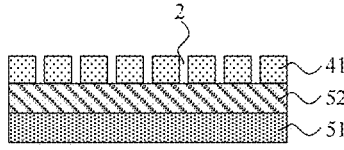
FIG. 11A-FIG. 11D are schematic diagrams of a filling process of a first structural hole according to an exemplary embodiment of the present disclosure.

(1) A mold substrate 52 is disposed on a glass carrier plate 51, and then a glass substrate piece 41 with first structural holes 2 manufactured by a method shown in FIG. 12 is disposed on a side of the mold substrate 52 away from the glass carrier plate 51, as shown in FIG. 11A.

Figure 11B:
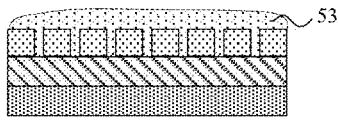

(2) The first structural holes 2 are coated with a filling material 53 using a scraping process, as shown in FIG. 11B.

Figure 11C:
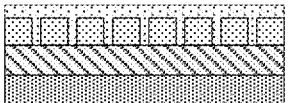

(3) The filling material is slicked to be flat and heated to cure, as shown in FIG. 11C.

Figure 11D:

(4) The glass carrier plate 51 and the mold substrate 52 are cooled and stripped from the glass substrate piece 41 with the first structural holes 2, that is, the glass substrate 41 in which the first structural holes 2 has been filled is obtained, as shown in FIG. 11D.

Figure 12A:
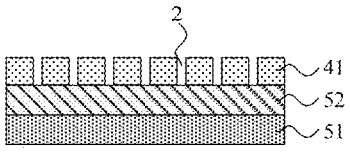
FIG. 12A-12C are schematic diagrams of another filling process of a first structural hole according to an exemplary embodiment of the present disclosure.
Figure 12B:
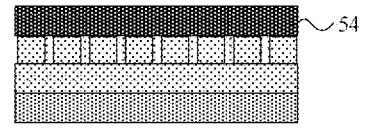
Figure 12C:

FIG. 12A-12C are schematic diagrams of another filling process of first structural holes according to an exemplary embodiment of the present disclosure. In an exemplary implementation, the filling process of the first structural holes may include the following steps.

(1) A mold substrate 52 is disposed on a glass carrier plate 51, and then a glass substrate piece 41 with first structural holes 2 manufactured by the method shown in FIG. 12 is disposed on a side of the mold substrate 52 away from the glass carrier plate 51, as shown in FIG. 12A.

(2) The first structural holes 2 are coated with a filling material, and an upper mold 54 is disposed on a side of the glass substrate piece 41 with the first structural holes 2 away from the glass carrier plate 51 to perform coating with a film pressing process, as shown in FIG. 12B.

(3) Flatten the filling material by pressing and cure the filling material with heat.

(4) The glass carrier plate 51, the mold substrate 52, and the upper mold 54 are cooled and stripped from the glass substrate piece 41 with the first structural holes 2, that is, the glass substrate 41 in which the first structural holes 2 have been filled is obtained, as shown in FIG. 12C.

According to the present disclosure, other processes may be employed to fill the structural holes with a filling material.

Figure 13:
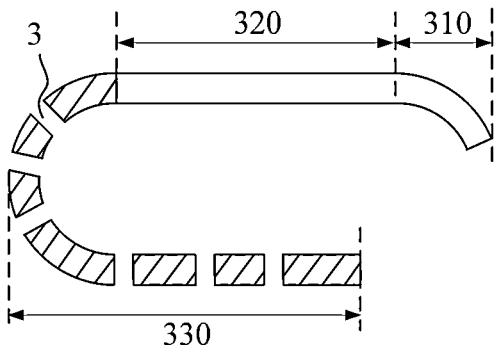
FIG. 13 is a schematic cross-sectional view of another glass layer according to an exemplary embodiment of the present disclosure.

FIG. 13 is a schematic cross-sectional view of another glass layer according to an exemplary embodiment of the present disclosure. As shown in FIG. 13, the glass layer 31 may include a bending part and a non-bending part corresponding to the bending area and the non-bending area of the display panel respectively. The bending part may include a fixed part 310 and a sliding-scrolling part 330. The non-bending part may include a flat part 320. The fixed part 310 and the sliding-scrolling part 330 are respectively located on two sides of the flat part 320 in the first direction X, and the fixed part 310 may be bent from the flat part 320 toward the Z direction along the first direction X.

In an exemplary implementation, at least one second structural hole 3 may be provided in the sliding-scrolling part 330 for enhancing the foldability of the sliding-scrolling part. The at least one second structural hole 3 may be in a form of a through-hole structure, i.e. the at least one second structural hole 3 penetrates through the glass layer 31, a depth of the at least one second structural hole 3 is the same as a thickness of the at least one sliding-scrolling part 330, and the thickness of the sliding-scrolling part 330 may be in a range of more than 200 μm to 800 μm, for example, in a range of 550 μm to 650 μm.

In an exemplary implementation, a cross-sectional shape of the fixed part 310 may be an arc shape and the arc-shaped fixed part 310 may be formed by a three-dimensional heat bending process.

In this embodiment, a glass with a thickness of 200 μm-800 μm is employed, and the glass in this range itself does not have bending characteristics. The bending characteristic of the glass layer is realized by providing at least one structural hole in the sliding-scrolling part of the glass layer. On the other hand, a fixed part of the glass layer is formed by a heat bending process. By the combination of the sliding-scrolling part with structural holes and the heat-bending fixed part may also realize that the slidable-scrollable display substrate, when being bent, can not only enhance the bending performance of the cover window, but also reduce the resilience force in the fixed part at an edge area of the cover window, thereby reducing the risk of peeling or separation among the film layers in the fixed part.

In one possible exemplary implementation, an organic polymer filling material may be provided in the at least one second structural hole 3. The organic polymer filling material may be a polymer with a same refractive index as a glass or a polymer which has a refractive index with a difference value from the refractive index of the glass being less than or equal to 0.005.

In the present disclosure, by disposing the filling material in the structural holes, not only the corresponding light and shadow problem is solved, it is also ensured that the sliding-scrolling part has extremely high impact resistance and surface tactility.

FIG. 14 is a schematic cross-sectional view of another glass layer according to an exemplary embodiment of the present disclosure. As shown in FIG. 14, the glass layer 31 may include a bending part and a non-bending part corresponding to the bending area and the non-bending area of the display panel respectively. The bending part may include a fixed part 310 and a sliding-scrolling part 330. The non-bending part may include a flat part 320. The fixed part 310 and the sliding-scrolling part 330 are respectively located on two sides of the flat part 320 in the first direction X.

In an exemplary implementation, at least one first structural hole 2 may be provided in the fixed part 310 and at least one second structural hole 3 may be provided in the sliding-scrolling part 330 at the same time. The at least one first structural hole 2 penetrates through the glass layer 31, and a depth of the at least one first structural hole 2 is the same as a thickness of the glass layer 31 of the fixed part. The at least one second structural hole 3 penetrates through the glass layer 31, and a depth of the at least one second structural hole 3 is the same as a thickness of the glass layer 31 of the sliding-scrolling part.

In one possible exemplary implementation, both the at least one first structural hole 2 and the at least one second structural hole 3 may be filled with an organic polymer filling material.

In this embodiment, by disposing the structural holes at the fixed part and the sliding-scrolling part at the same time, not only the resilience force of the fixed part is reduced, but also the foldability of the sliding-scrolling part is enhanced.

The present disclosure provides a display device, by employing a glass with bending property and a glass without bending property as a glass layer, and providing a structural hole is in at least one of the bendable parts of the fixed part and the sliding-scrolling part of the glass layer, it can not only ensure the bending performance and impact resistance of the cover window in a sliding-scrolling state, but also reduce the resilience force in the fixed part at the edge area of the cover window, thereby reducing the risk of peeling or separation among the film layers in the fixed part.

The display device of the present disclosure may also include various combinations and arrangements of various perforated glass layers and other components of the display panel according to an exemplary embodiment of the present disclosure, which will not be repeated herein.

The display device according to an exemplary embodiment of the present disclosure may be any product or component with a display function, such as a mobile phone, a tablet computer, a television, a display, a laptop computer, a digital photo frame, or a navigator.

Although the implementations disclosed in the present disclosure are as above, the described contents are only implementations used for convenience of understanding the present disclosure and are not intended to limit the present disclosure. Any person skilled in the art to which the present disclosure pertains may make any modification and variation to implementation forms and details without departing from the spirit and scope disclosed in the present disclosure. However, the scope of patent protection of the present disclosure is still subject to the scope defined by the appended claims.

The invention claimed is:

1. A display panel, comprising a fixed region, a flat display region and a sliding-scrolling region, wherein the fixed region and the sliding-scrolling region are respectively located on two sides of the flat display region in a first direction, the fixed region is configured to be fixedly connected with a middle frame, the flat display region is configured to display an image, the sliding-scrolling region is configured to form a rolled-up state and an extended state by sliding-scrolling, the sliding-scrolling region displays an image together with the flat display region in the extended state;; and on a plane perpendicular to the display panel, the display panel at least comprises a display substrate, an adhesive layer disposed on the display substrate and a cover plate layer disposed on a side of the adhesive layer away from the display substrate, the cover plate layer at least comprises a glass layer, at least one of the glass layer of the fixed region and the glass layer of the sliding-scrolling region is provided with at least one structural hole, a shape of the at least one structural hole is a strip shape extending along a second direction, and the first direction intersects with the second direction; and wherein the at least one structural hole comprises a first structural hole, the first structural hole is provided in the glass layer of the fixed region, a depth of the first structural hole is the same as a thickness of the glass layer of the fixed region, and the thickness of the glass layer of the fixed region is 50 μm to 200 μm.

2. The display panel according to claim 1, wherein a thickness of the glass layer of the sliding-scrolling region is 25 μum to 80 μm.

3. The display panel according to claim 1, wherein the at least one structural hole further comprises a second structural hole, the second structural hole is provided in the glass layer of the sliding-scrolling region, a depth of the second structural hole is the same as a thickness of the glass layer of the sliding-scrolling region, and the thickness of the glass layer of the sliding-scrolling region is 200 μm to 800 μm.

4. A display panel, comprising a fixed region, a flat display region and a sliding-scrolling region, wherein the fixed region and the sliding-scrolling region are respectively located on two sides of the flat display region in a first direction, the fixed region is configured to be fixedly connected with a middle frame, the flat display region is configured to display an image, the sliding-scrolling region is configured to form a rolled-up state and an extended state by sliding-scrolling, the sliding-scrolling region displays an image together with the flat display region in the extended state; and on a plane perpendicular to the display panel, the display panel at least comprises a display substrate, an adhesive layer disposed on the display substrate and a cover plate layer disposed on a side of the adhesive layer away from the display substrate, the cover plate layer at least comprises a glass layer, at least one of the glass layer of the fixed region and the glass layer of the sliding-scrolling region is provided with at least one structural hole, a shape of the at least one structural hole is a strip shape extending along a second direction, and the first direction intersects with the second direction;; and wherein on a plane perpendicular to the display panel, a cross-sectional shape of the glass layer of the fixed region is an arc shape, and the arc-shaped glass layer of the fixed region is formed by a three-dimensional heat bending process.

5. A display panel, comprising a fixed region, a flat display region and a sliding-scrolling region, wherein the fixed region and the sliding-scrolling region are respectively located on two sides of the flat display region in a first direction, the fixed region is configured to be fixedly connected with a middle frame, the flat display region is configured to display an image, the sliding-scrolling region is configured to form a rolled-up state and an extended state by sliding-scrolling, the sliding-scrolling region displays an image together with the flat display region in the extended state; and on a plane perpendicular to the display panel, the display panel at least comprises a display substrate, an adhesive layer disposed on the display substrate and a cover plate layer disposed on a side of the adhesive layer away from the display substrate, the cover plate layer at least comprises a glass layer, at least one of the glass layer of the fixed region and the glass layer of the sliding-scrolling region is provided with at least one structural hole, a shape of the at least one structural hole is a strip shape extending along a second direction, and the first direction intersects with the second direction; and wherein the at least one structural hole comprises a first structural hole and a second structural hole, the first structural hole is provided in the glass layer of the fixed region, and the second structural hole is provided in the glass layer of the sliding-scrolling region.

6. The display panel according to claim 1, wherein the cover plate layer further comprises a filling layer, and the at least one structural hole is filled with the filling layer.

7. The display panel according to claim 6, wherein a material of the filling layer comprises an organic polymer material.

8. The display panel according to claim 6, wherein a difference between a refractive index of the material of the filling layer and a refractive index of the glass layer is less than or equal to 0.005.

9. The display panel according to claim 1, wherein each structure hole has a length in the second direction and a width in the first direction, and the length is greater than the width.

10. The display panel according to claim 9, wherein in the second direction, the structural hole comprises a first end part, a second end part, and a main body part between the first end part and the second end part, a shape of the main body part is a strip shape extending along the second direction on a plane parallel to the display panel, and shapes of the first end part and the second end part are semicircular.

11. The display panel according to claim 10, wherein the main body part comprises end regions adjacent to the first end part and the second end part and a middle region away from the first end part and the second end part, and a width of the middle region is less than or equal to a width of an end region.

12. The display panel according to claim 11, wherein a width of the main body part increases along a direction from the middle region to the end region.

13. The display panel according to claim 12, wherein the width of the middle region is 30% to 70% of the width of the end region.

14. The display panel according to claim 9, wherein the at least one structural hole comprises a plurality of hole columns disposed sequentially along the first direction, each hole column comprises a plurality of structural holes dis-posed sequentially along the second direction; the plurality of hole columns comprises a plurality of odd-numbered hole columns and a plurality of even-numbered hole columns, structural holes in the plurality of odd-numbered hole columns are aligned with each other in the second direction, structural holes in the plurality of even-numbered hole columns are aligned with each other in the second direction, and the structural holes in the odd-numbered hole columns and the structural holes in the even-numbered hole columns are staggered disposed in the second direction.

15. The display panel according to claim 14, wherein a first spacing is formed between a centerline of structural holes of at least one odd-numbered hole column and a centerline of the structural holes of an even-numbered hole column adjacent in the first direction, the first spacing is 0.5 time to 3 times of the width, and the centerline is a line passing through geometric centers of the structural holes along the second direction.

16. The display panel according to claim 15, wherein in a hole column adjacent to at least one structural hole, a second spacing is formed between the structural holes in the second direction, and the second spacing is 10% to 30% of the length.

17. The display panel according to claim 14, wherein a misaligned distance is formed between a center point of a structural hole of at least one odd-numbered hole column and a center point of a structural hole of a staggered disposed even-numbered hole column adjacent in the first direction, the misaligned distance is 40% to 60% of the length, and the center point of the structural hole is a geometric center of the structural hole.

18. A display device, comprising the display panel according to claim 1.

* * * * *